United States Patent
Koyabe et al.

(10) Patent No.: US 9,674,342 B2
(45) Date of Patent: Jun. 6, 2017

(54) CABLE DAMAGE DETECTION

(71) Applicant: British Telecommunications Public Limited Company, London (GB)

(72) Inventors: Martin Wanyonyi Koyabe, London (GB); Zhan Cui, London (GB)

(73) Assignee: BRITISH TELECOMMUNICATIONS PUBLIC LIMITED COMPANY, London (GB)

( * ) Notice: Subject to any disclaimer, the term of this patent is extended or adjusted under 35 U.S.C. 154(b) by 0 days.

(21) Appl. No.: 14/388,899

(22) PCT Filed: Mar. 21, 2013

(86) PCT No.: PCT/GB2013/000117
§ 371 (c)(1),
(2) Date: Sep. 29, 2014

(87) PCT Pub. No.: WO2013/144539
PCT Pub. Date: Mar. 10, 2013

(65) Prior Publication Data
US 2015/0085994 A1   Mar. 26, 2015

(30) Foreign Application Priority Data

Mar. 30, 2012  (EP) .................................. 12250081
Mar. 20, 2013  (GB) ................................. 1305132.1

(51) Int. Cl.
*H04M 1/24* (2006.01)
*H04M 3/08* (2006.01)
(Continued)

(52) U.S. Cl.
CPC ......... *H04M 3/305* (2013.01); *H04L 43/0811* (2013.01); *H04L 43/16* (2013.01);
(Continued)

(58) Field of Classification Search
CPC ...... H04M 3/306; H04M 1/24; H04M 11/062; H04M 3/08; H04M 3/22; H04M 3/26
(Continued)

(56) References Cited

U.S. PATENT DOCUMENTS 5,182,744 A * 1/1993 Askew et al. ................ 370/228
8,320,527 B2 11/2012 Hoy
(Continued)

FOREIGN PATENT DOCUMENTS

EP    0494513 A2   7/1992
EP    2645686 A1   10/2013

OTHER PUBLICATIONS

International Application No. PCT/GB2013/000117, filed Mar. 21, 2013, International Search Report, mailed Oct. 24, 2013, 6 pages.
Falconer, W. E., *Service Assurance in Modern Telecommunications Networks*, IEEE Communications Magazine, IEEE Service Center, vol. 28, No. 6, Jun. 1, 1990, pp. 32-39.
(Continued)

*Primary Examiner* — Quoc D Tran
(74) *Attorney, Agent, or Firm* — Patterson Thuente Pedersen, P.A.

(57) ABSTRACT

A system for monitoring connection status of a cable in a network comprising a detector operationally connected to the cable, a metal line test module, and a processor for receiving from the detector one or more connection status reports about connection of the cable to a network node, and configured to cause, upon a connection status report threshold being reached, a test of the cable by the metal line test module to confirm the connection status of the cable. Related apparatus and methods are also disclosed.

13 Claims, 6 Drawing Sheets

(51) Int. Cl.
*H04M 3/22* (2006.01)
*H04M 3/30* (2006.01)
*H04L 12/26* (2006.01)
*H04M 3/10* (2006.01)
*H04M 11/06* (2006.01)
*G01R 31/04* (2006.01)

(52) U.S. Cl.
CPC .............. *H04L 43/50* (2013.01); *H04M 3/08* (2013.01); *H04M 3/085* (2013.01); *H04M 3/10* (2013.01); *H04M 3/2209* (2013.01); *G01R 31/04* (2013.01); *H04M 11/062* (2013.01)

(58) Field of Classification Search
USPC ..... 379/1.01, 1.03–1.04, 14.01, 22.03, 29.01
See application file for complete search history.

(56) References Cited

U.S. PATENT DOCUMENTS

| | | |
|---|---|---|
| 2006/0098725 A1 | 5/2006 | Rhee |
| 2008/0086661 A1* | 4/2008 | Harrell ............... H04L 41/0686 714/100 |
| 2008/0181100 A1* | 7/2008 | Yang ................... H04L 41/0681 370/216 |
| 2009/0034690 A1* | 2/2009 | Djurovic et al. ............ 379/1.04 |
| 2009/0263132 A1 | 10/2009 | Rafel et al. |
| 2009/0282292 A1* | 11/2009 | Squire ............................ 714/39 |
| 2011/0116607 A1* | 5/2011 | Patel et al. ........................ 379/2 |

OTHER PUBLICATIONS

Tarle H., *FMAS—An Operations Support System for Transport Networks*, Ericsson Review, vol. 67, No. 4, Jan. 1, 1990, p. 163-182.

* cited by examiner

CABLE DAMAGE DETECTION

RELATED APPLICATIONS

The present application is a National Phase entry of PCT Application No. PCT/GB2013/000117, filed Mar. 21, 2013, which claims priority to EP 12250081.2, filed Mar. 30, 2012 and also claims priority to GB 1305132.1, filed Mar. 20, 2013, the contents of which are incorporated herein by reference in their entireties.

TECHNICAL FIELD

Embodiments relate to apparatus, systems and methods relating to a detection of damage to a cable, particularly but not exclusively in respect of copper cables in a telecommunications network.

BACKGROUND

Metal, and particularly copper, cables are deployed in a variety of industries such as the telecommunications, rail, and power sectors as a conductive medium for the transmission of e.g. telecommunications signals and electricity. When essential transmission lines are damaged, the resulting consequences can be far-reaching with potential loss to life and limb and a threat to national security. The extent of damage to the cable itself ranges from the relatively minor (resulting in a reduction of the cable's transmission capacity) to major structural damage affecting the physical integrity of the cable. This includes breaks, splits, partial cuts, and at an extreme, a complete cable cut. Cables are inherently at risk on a day-to-day basis: for example, it is not unusual for cables to be accidentally cut through by an excavation vehicle, or damaged through deliberate vandalism. In recent times, this risk is worsened by soaring scrap metal prices, which has in turn escalated the number of metal theft incidences worldwide. In such cases, not only has the damage to be repaired, but the length of stolen cable has to be re-provisioned and -installed, requiring even more time and cost for the resumption of normal service.

In addition to the task of detecting cable damage in the first place, there is the issue of identifying the location of the damaged cable in often extensive copper networks, for which comprehensive and up-to-date asset records and registers may not exist. As might be expected, it is crucial to pinpoint the location of the damage without delay, particularly in the context of hoping to catch copper thieves in the act and before the cables are removed from the installation.

In specific applications in the telecommunications sector, copper cables are typically deployed mainly in the access network. Depending on the chosen network architecture, copper lengths are provided between the customer premises to the local exchange or to points closer to the customer e.g. to the street cabinet (FTTC), to the curb, or the like. Even in a theoretically all-fiber Fiber to the Premises/Home access network implementation (FTTP/FTTH), a legacy voice Plain Old Telephone Service (POTS) copper network might remain in use in parallel to the fiber network.

These lengths of copper are vulnerable to the kinds of damage discussed above, and are also potential targets for metal thieves. The metal theft epidemic is reaching crisis levels, with governments passing new laws in attempts to contain the problem. Security measures in use in the UK presently include use of physical locks, fencing and barbed wire, video camera and alarm systems, and marking copper plant with SmartWater™ (a liquid containing a chemical code for identification, which is invisible to the naked eye). British Telecommunications plc (BT plc) also have a dedicated Metal Theft Task Force, which is tasked to operate the security systems and to thwart and respond to such incidents by gathering and analyzing intelligence from cable theft incidents, as well as to help disrupt disposal routes for stolen metal. Yet other solutions proposed involve laying a spare cable alongside all existing cables for the purpose of detecting cuts, which are periodically line tested, which is seldom commercially feasible or practical. Cables with reduced copper content to make them less valuable to thieves have also been developed, but this approach does not address the difficulties faced in already-deployed cables.

An issue concerns the location of the problem within a geographically extensive network, which typically extends the length and breadth of a region or country. In most countries, the access network comprises copper cables in whole or in part, which will be the target for copper thieves. However, network faults adversely affecting service can arise anywhere i.e. outside the access network in the core network. While optical fiber is the more typical transmission medium in the core, it is not unknown for less experienced would-be copper thieves to dig up fiber cables located in the core network and elsewhere in error.

The cost to network operators and owners is, as might be excepted, immense. In the UK, the large volume of connection faults arising from damage caused e.g. by copper theft directly result in considerable network downtime as repair activity gets underway locating and identifying the location and cause of the fault (which may itself take hours, even before repair work begins). This results in significant time and cost to all parties, and network operators suffer harm from an often-unquantifiable but very real loss in customer goodwill.

A method of detecting problematic links in the core network is described in EP494513, in which telecommunications traffic over optical fibers in the core network is re-routed to avoid a faulty link identified by using line termination equipment to track and count line synchronization errors. This method cannot however be used for the speedy identification or localization of damage or cuts to metallic wire or cable especially in the access network.

It would be desirable to detect cable damage such as cuts in real time or near-real time in such a way so as to impart a high level of confidence in the system's findings, which at the same time also identifies the cable damage location within a network, in the form of a solution which is economically viable, deployable in practice within an existing network and requires little infrastructure change. The detection process should ideally be capable of identifying and locating faults within the access network, caused by events or incidents from outside the access network, and regardless of the underlying broadband or other technology being used within the network. There are now no known economically viable solutions to detect cable cuts or other damage and to swiftly identify the damage location(s), using existing network infrastructure or which involve very little change or adaptation of existing methods or systems so as to allow for immediate deployment and adoption.

SUMMARY

In an embodiment, there is provided a system for monitoring connection status of a cable in a network comprising a detector operationally connected to the cable, a metal line test module, and a processor for receiving from the detector one or more connection status reports about connection of the cable to a network node, and configured to cause, upon a connection status report threshold being reached, a test of the cable by the metal line test module to confirm the connection status of the cable.

The monitoring system serves as a "burglar alarm" in respect of cable faults or damage to cables in a network, wherein a processor is configured to go through two steps: first to initially identify a loss of connection, and then to verify the initial identification. This reduces the chances of generating false alarms concerning the connection status of a cable or wire within a network. The exemplary description covers a telecommunications network, but the skilled person would appreciate that the invention can be employed in respect of cables or such other metal plant in other networks or industry e.g. the railway network to realize similar advantages. In the example discussed here, cable damage is suffered in events of theft of metallic, typically, copper, cables.

Embodiments can be implemented in a variety of ways. The detector monitors the connection status of a cable along the link between a customer premises to a node in the network which might be located in the access, or nearer or within the core of the network. With particular reference to telecommunication networks, the connection status reports can take any form which provides an initial alert within the network that connection has been lost between the customer premises and a network node. The network node can comprise an access module such as a Digital Subscriber Line Access Multiplexer (DSLAM) or a Multi-Service Access Node (MSAN) (which shall be included in references to "DSLAM" as the context permits). In such as case, the loss of connection alarm can take the form of a Loss of Synchronization (LoS) signal. Alternatively, the monitored link can comprise that section between the customer router and the broadband remote access server (BRAS), in which case the connection status reports could take the form of dropped sessions data.

In a DSLAM-based implementation embodiment (referred to as the "DSLAM" implementation), the monitored link is the section between the customer end and the DSLAM. In the implementation described below, the detector can also be located within or near the DLSAM. In use, the detector generates an initial connection status report or alert about the possibility that the cable it is monitoring has been faulty, damaged or cut. An LoS alarm is sent to a processor which sole or primarily function is to process status connection reports from the server to determine the likelihood that the connection loss is of a type which warrants further action. This acts as a second line in determining if the connection status of the cable as reported by the detector represents cable damage of the type which the network operator deems to require an intervention, such as sending out the police in the event of thieves cutting the cable to steal the copper.

In the "DSLAM" implementation, the processing carried out by the processor, which can take the form of a standard server computer, comprises counting the number of connection status alerts received from the detector which relate to a particular cable or cable bundle identified in the status reports received by the processor. If the received reports reach or exceed a given threshold in respect of the particular cable or cable bundle within a predetermined time, a metallic line test is carried out to check the connection of the cable to the access network node.

Other criteria for setting the threshold of received LoS alarms in the "DSLAM" implementation can be used: for example, to include in the count not only the cable about which LoS alarms are being sent, but also all those which are connected to the same DSLAM as the cable about which alarms are being sent. Also, it may be possible to modify the stated threshold criteria e.g. by leaving out the time element, so that the processor flags up LoS alarms about a particular cable(s) regardless of when they arrive, which may provide a profile of a direct-buried link gradually disintegrating over time in a particular soil type.

In one advantageous implementation of the "DSLAM" implementation, the connection status LoS reports are sent to the processor via an Element Manager System (EMS). EMSs already exist within networks and are a ready source of status connection reports sent to it by large numbers of network elements. Rather than for the processing unit to set up new links to access nodes such as DSLAMs and MSANs, it would be much more efficient to have the EMSs forward status reports to the processor.

In a second, RADIUS-based, implementation embodiment (referred to as the "RADIUS" implementation), the monitored link lies between the customer premises (e.g. a broadband router in the premises) and a network node such as the BRAS unit Loss in connection in the link can take the form of "dropped sessions" in the link established under the point-to-point protocol (PPP). Such dropped session data is sent to a processing unit. When the number of connection status reports received by the processor indicates a number of lost connections reaching or exceeding a predetermined connection status report threshold, the metal cable is line tested. In one embodiment, a remote authentication dial-in user service (RADIUS) unit serves as the detector.

In the typical situation where the network comprises a number of cables, the processor is further configured to receive data about the network in the form of e.g. routing data and network infrastructure, which helps to identify and/or locate the cable(s) for which the connection status reports are being received by the processor. This enables the two-step process which respectively initially identifies, and then confirms, the existence of a cable fault resulting from damage of the kind which might be expected from e.g. cable theft. This may be contrasted with the kind of connection loss resulting from e.g. a self-correcting condition, or where the customer has intentionally turned off his router. In this way, the number of false alarms generated can be significantly reduced, which gives confidence in the findings made by the system which need to be action upon. The methods and apparatus of embodiments advantageously combine a swift initial identification to be made of a potential problem in the first step, while providing inbuilt verification of the initial finding by the system.

An optional but advantageous aspect of embodiments provides a third line of data analysis, in which a line test result confirming the existence of the kind of problem needing action, is checked further against external data which are likely to have an impact on the connection status of the cable. Such external information can be obtained from a variety of sources, such as an Operation Support System (OSS) database, weather forecast websites, databases maintained by power companies and other utility service providers, and the like. For example, knowledge about a localized power failure will clarify that the connection problem is probably not due to cable theft. Further processing or reviewing the line test result in this way will therefore improve even further the accuracy of the determination of the existence and potentially, the type of damage suffered by the cable(s) in question. This aspect of embodiments provides a qualitative analysis of the connection status data, in comparison with the earlier steps in which the tests are exclusively or mainly quantitative.

In carrying out the two-step process, first and second alerts (representing increasing levels of certainty that the cable fault if of a type needing further action) are generated, allowing for parties to decide what if any, action should be taken.

In embodiments, the system also triggers the generation of messages and reports (including mapping information) e.g. in the form of emails, updated websites, SMS messages, telephone calls of the like to parties interested in and affected by the problem, such as the police and other authorities, internet service providers and communications providers, large enterprise customers, and personnel at local exchanges. Such notifications allow the recipients to take speedy and pre-emptive action e.g. rushing to the affected site to apprehend suspected cable thieves. Status reports can also be loaded onto OSS and such systems, which will update the entire network operator organization: this allows for a quick response to repair the damaged link and can be explained to irate customers suffering from lost service. Another advantage is that spurious and duplicative test and diagnosis activities by higher layer fault diagnosis systems such as IP fault diagnosis or application layer services can be avoided.

Embodiments of the system therefore use network elements and outputs which already exist and are operational in the access network, allowing for quick and cost-efficient implementation. Another significant advantage is that the process is entirely automated and enables real time or near-real time processing of data potentially indicative of cable damage.

According to another embodiment, there is provided a method of monitoring connection status of a cable operatively connected to a detector, comprising receiving from the detector one or more connection status reports about connection of the cable to a network node, and causing, upon a connection status report threshold being reached, a metal line test of the cable to confirm the connection status of the cable to a network node.

Again, the loss of connection status report can relate to the connection between the customer and the DSLAM or the BRAS, in different implementations.

Embodiments of the methods allow for real- or near-real-time monitoring of a network, and in one advantageous implementation include generating and sending a connection status alert upon identification of an actual incident of cable fault or damage.

BRIEF DESCRIPTION OF THE DRAWINGS

Embodiments of systems, methods and apparatus will now be described by way of example only, with reference to the following drawings, wherein.

DETAILED DESCRIPTION

As noted above, embodiments can be implemented in a variety of ways. Two specific implementations will now be described.

The "DSLAM" Implementation

Figure 1A:
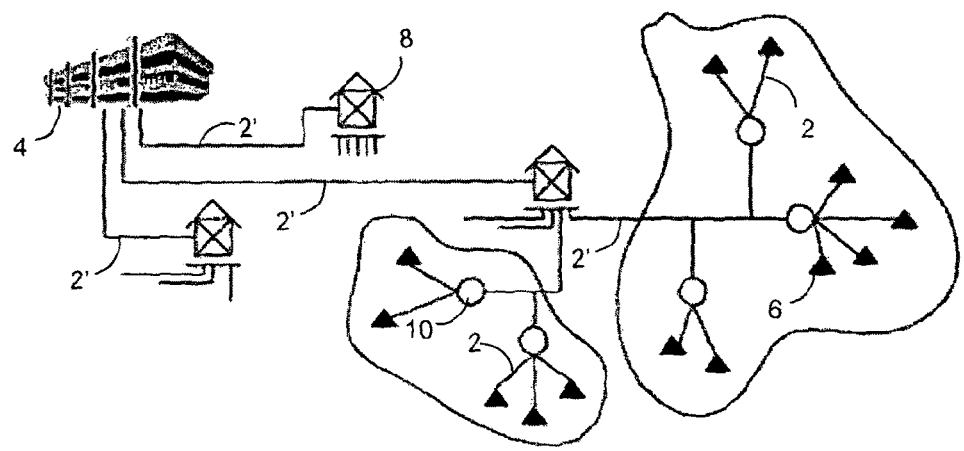
FIGS. 1A and 1B are depictions of components making up an access network of the prior art.

FIG. 1A depicts the relevant components of a conventional telecommunications access network. Individual copper cable pairs (2) connect customer premises (6) to the local exchange or a central office (4) in a branching topology via primary cross-connection connect points (8) and distribution points (10). Telephone lines (2) from customer premises are grouped into increasingly larger bundles (2') at each junctioning point along the link to the local exchange, eventually comprising bundles (2') of tens, hundreds or even thousands of copper pairs leading into the exchange. In general, the greater the number of links in the bundle, the nearer to the exchange the link is likely to be. At the opposite, customer, end of the link, there is typically just one copper pair (2) serving the premises per account. Knowledge of which and how many cables are affected can, on its own, allow an approximation of the location of the damaging activity, due to the branching cable topology of the access network.

Figure 1B:
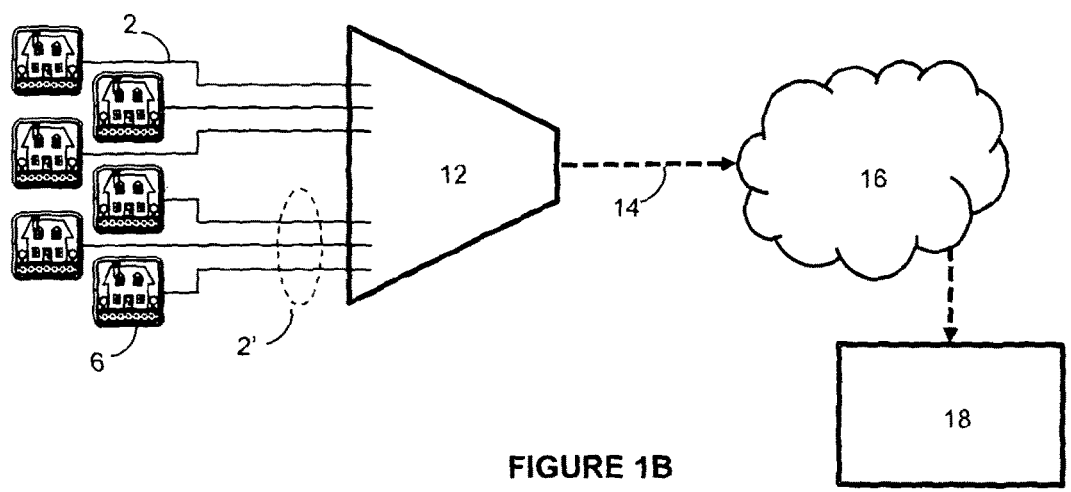

Another view of the access network configuration is shown in FIG. 1B, in which each of a plurality of customer premises (6) is connected by a copper cable (2) to an access node in the form of a DSLAM or an MSAN (12) located within the local exchange. (For ease of description, references to the DSLAM herein shall include a reference to MSANs where the context permits.) As noted above, the DSLAM module can be placed at points closer to the customer in various FTTx network architectures.

One of the functions of DSLAMs is to monitor their links to Customer Premises Equipment such as modems, home hubs or the like. Any loss of signal or synchronization (LoS) would typically cause the DSLAM at the exchange end to raise an LoS alarm (14), indicative of an issue relating to the connection with the customer premises in question. The problem can be caused by a number of reasons, ranging from line management problems to a fatal cable cut. LoS alarms generated by the DSLAMs are forwarded to an EMS (18) via the access network (16).

An EMS is a network management tool in respect of network elements (i.e. network devices such as DSLAMs, MSANs, line cards, and the like) within the access network, in which one EMS is used to manage a number of exchanges. As there are only a dozen or so EMSs in operation in the whole of the UK, each EMS manages an enormous number of network elements, for which it provides support in five areas: Fault, Configuration, Accounting, Performance and Security (generally indicated by the acronym "FCAPS"). The EMS is an interface between network devices and network on the one hand, and service management systems e.g. an OSS on the other. In use, an EMS will typically receive huge numbers of alerts and alarms over a given period, due in part of the sheer number of network devices supported by each EMS, and the variety of fault types that might arise. By way of example, it is typical for an EMS to receive millions of just LoS alarms, each day. It is seldom productive for the EMS to review every one of these LoS messages, because as noted above, the vast majority of them pertain to non-critical issues (e.g. the customer has turned his modem off) and moreover often self-correct (e.g. temporary line faults and local power failures). Due to the high proportion of "false" alarms ("false" insofar as they relate to events which do not need specific intervention for present purposes), LoS messages are usually ignored and dropped by the EMS.

Figure 2:
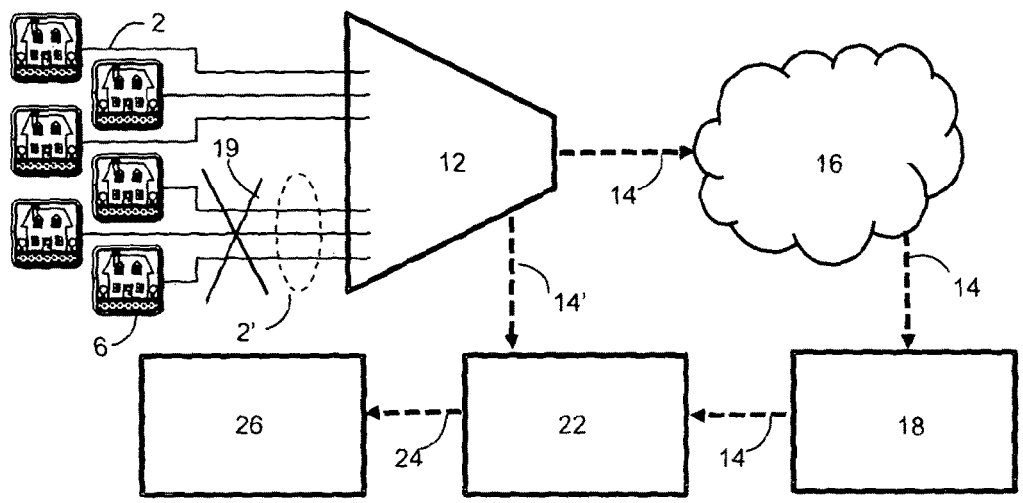
FIG. 2 depicts the components making up a cable damage detection system of an embodiment of the "DSLAM" implementation.

Turning now to FIG. 2, this is a block diagram of a first implementation of an embodiment. In the representation of the access shown, a section of the link between the customer premises (6) and the local exchange (or street cabinet) as represented by the DSLAM (12) has been damaged or cut (19). The affected section is a cable bundle (2') located nearer the exchange, comprising a number of individual copper pairs. At the start of the process (51 in the flow chart of FIG. 3), a LoS alert (14) is generated by the DSLAM (12) in the known manner, and sent (S2 in flow chart of FIG. 3) through the access network (16) to the EMS (18). Conventionally, the LoS alarm would be dropped with millions of other LoS alarm messages received at the EMS. In an exemplary implementation discussed here, however, the alarm (14) is instead forwarded (S3) to a special-purpose processing unit (22) which sole or main purpose is to receive and process LoS alarm data from EMSs.

The LoS alarm processing unit (22) comprises an appropriately configured server on a standard, known, computer in the access network configured to perform routines and logical functions to enable the further processing of LoS alarms. Its primary task is to process the LoS alarm data arriving from one or more EMSs, to provide a first indication of the possibility of damaged e.g. a cut cable in the access network. While it is technically possible for the DSLAM or the EMS to undertake the task of processing alarm data in the manner described herein, this is not practically feasible owing to the lack of capacity for it to do so. The LoS alarms processor should therefore preferably have sufficient operational and processing capacity to carry out its functions itself without having to burden other components (which might degrade overall network performance) within the network.

Figure 4:
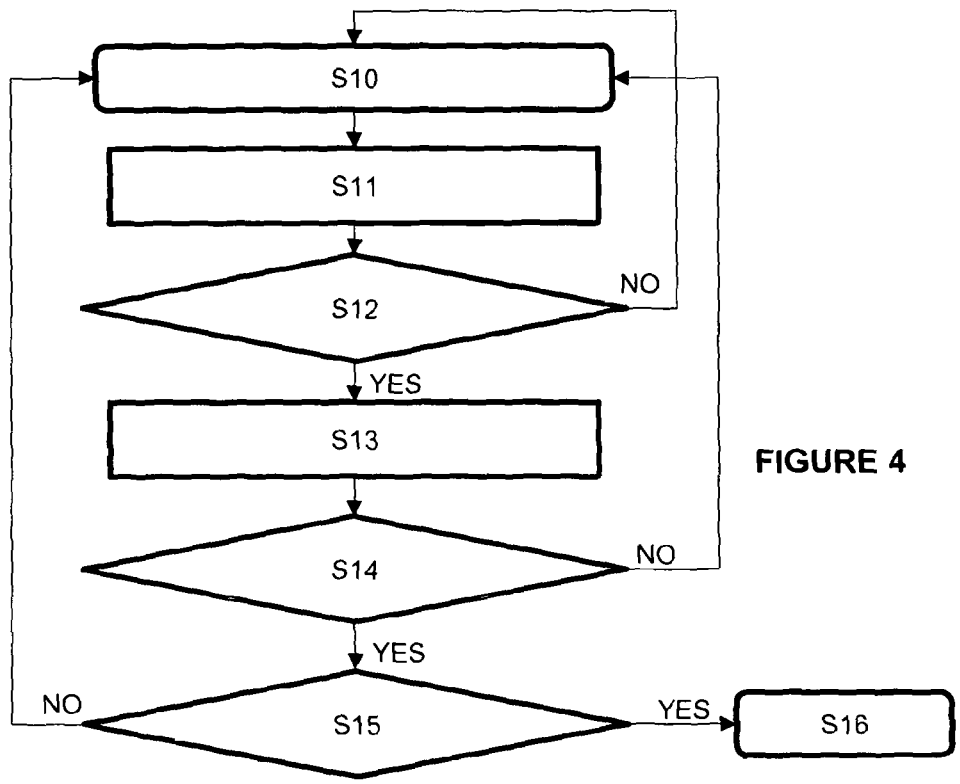
FIG. 4 is a flow chart of the process of determining if an initial alert is a true indication of cable damage in the "DSLAM" implementation.

The way in which the LoS alarm processing module carries out its functions (S10 to S15) is shown in more detail in the flow chart of FIG. 4. At the beginning of the process at S10, the processing unit is ready to receive LoS alarm signals from one or more EMSs. At S11, the processing unit receives a LoS alarm, the message including identification and status data (40, FIG. 5) such as line card ID, port number, time stamp data, and Directory Number (DN) or telephone line number, which allows identification of the customer line the particular LoS alarm pertains to. The system can optionally be set up to look at alarms originating from a particular DSLAM or segment of the network.

The processing unit reviews the content of received LoS alarm messages and counts those pertaining to a particular cable or cable bundle. If, in S12 the count reaches or exceeds a threshold number, an initial alert is generated. The threshold comprises a predetermined number of LoS alarms about a particular cable or bundle within a predetermined time, e.g. 30 or 60 seconds, which is sometimes referred herein as a "rush of LoS alarms." The threshold is selected and set by the network operator based on e.g. past experience and historical data, or on trial and error. In embodiments the threshold alarm numbers and time periods can be resettable metrices.

The skilled person would appreciate that various criteria may be used for threshold setting: for example, based on the speed at which LoS alarms are being received, instead of looking at the total number of alarms received per time period. In an example where a bundle of wires has been cut through, an LoS alarm would be generated for each cut cable, which would all arrive at the processing unit at almost the same time.

If it is determined by the LoS processor (22) that the alarms generated do initially indicate a cut cable or the like, a request (24) for a line test is sent in step S13, preferably to a line test module (26). In the context of an affected cable bundle, it is not necessary to test all the wires in the bundle where a sample of a small number (e.g. 5 to 10 individual pairs) can yield sufficiently accurate results. So for example, where the sample cables do not confirm the initial LoS suspicion of damage, it may be assumed that the bundle had been subject to power loss.

There are various known methods of line-testing wires or metallic cables, such as using a test head in the exchange to measure line resistance or capacitance to estimate the length of the copper pair from the local exchange. A comparison of the result with what the length should be as recorded in e.g. an asset register such as the PIPeR database described below or the like which will give an indication as to whether the cable if damaged. This technique also indicates the location of the fault in the network. There are alternatives to line tests of the above described type, such as loopback tests in which data sent into the cable and verifying if this is returned to source, time domain reflectometers which use echo ranging, and so on. References to "line tests" or "metal lines tests" in the application shall be deemed to include all suitable methods for determining if a metal cable or link is physically damaged along its length rendering it incapable of onwardly transmitting signals.

The findings of the line test module (26) are sent back in step S14 to the LoS alarm processor (22). If the results indicate a damaged or cut cable, the LoS alarm data (14) can be further reviewed in S15, to confirm the results of the line test before further action is taken. The further or final review involves checking or verifying the system's initial finding.

The above process may include optional further review or verification steps. For example, the line test result or other data indicating a Potential or Actual Incident may be refined or checked against external or other data, which could also help determine the nature of the damage, which in turn would affect the kind of response to made. Examples of considerations taken into account in this further processing or review (and possible conclusions) include:

Time of day

A cable cut during weekday working hours may indicate accidental damage by an excavation vehicle, while late night damage may point to copper theft.

Historic incidences

Previous occurrences of theft in the area may point to a repeat incident.

Location and/or identity of affected circuits

If all the cables known to be bundled together are all affected at the same time, it is unlikely that the customers served by these cables had all switched off their modem at the same time.

Geographic location

A rush of LoS alarms involving a single copper pair (2") near customer premises yielding very little scrap metal is less likely to be the result of theft.

Known events

Examples include planned power cuts, floods and the like in the affected location, or work being carried out on the network, all of which could or mitigate against a confirmation of the initial alert, or change the urgency or type of response that would otherwise made in the particular case.

Figure 5:
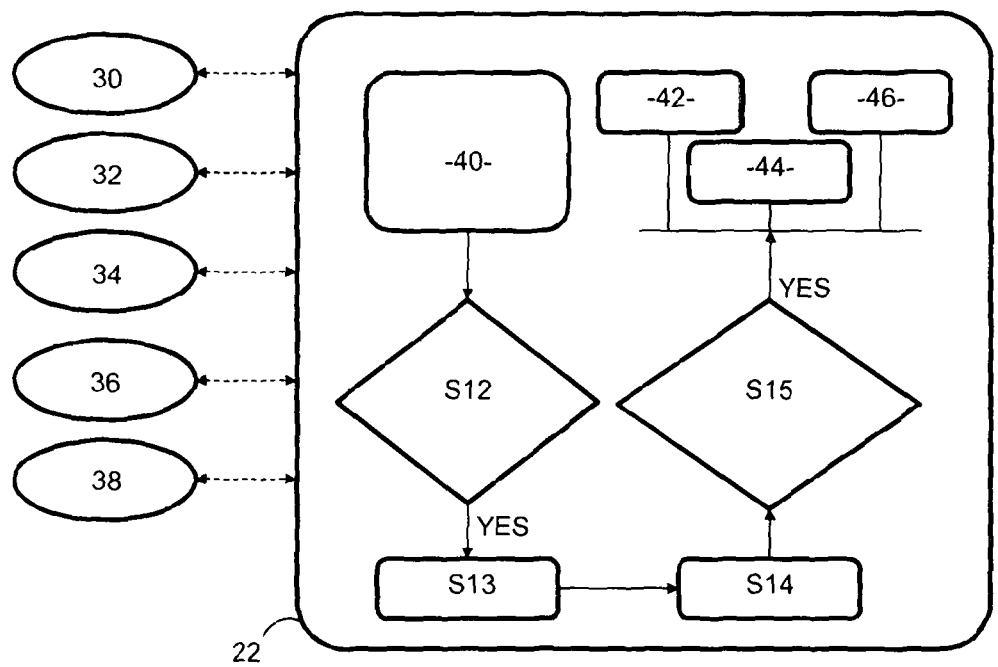
FIG. 5 depicts the inclusion of network operational data in the process of detecting cable damage in the "DSLAM" implementation.

The additional or external considerations which are used for further processing the connection status data can be obtained from a variety of sources, including the network operator's own OSS-based customer databases, billings databases, asset registers, physical inventories, and the like (30 to 38 in FIG. 5). A specific database can also be built for the system into which can be included current network conditions, information about network repairs, and so on. Yet further information sources include weather reports and forecasts, scheduled excavation work by utility providers, and the like. All this additional information can improve the accuracy of the initial suspicion (by the LoS alarms processing unit) and the finding of cable damage (by the line test unit), although it can be expected that feeding excessive amounts of external data in the final review of S15 may not only complicate matters, but also delay the eventual response of the system.

Depending on whether the results (S16 of FIG. 3) of the further review in S15 confirm the initial suspicion that the cable has been damaged or cut, and/or indicate the probable type or cause of damage, an appropriate report is generated as a connection status alert and sent in S17. The skilled person would appreciate that it is possible to set up a system which excludes this optional S15, so that once the line test is complete and shows that the cable or cable bundles have indeed been damaged, the processing unit moves at once to S17 to send an appropriate message(s) or report(s).

In S17, reports are generated and sent automatically and automatedly. Real time urgent updates can also be sent to commercial customers such as servicer providers (42, FIG. 5), or to the authorities such as the police (44, FIG. 5). In the context of metal theft, the ability of the system to identify a cut cable and its probable location within minutes, enables the rapid dispatch of personnel to the affected site e.g. within 15 minutes of the act of cutting the cable, potentially to catch the culprits red-handed. Constant monitoring of all lines on the network in the manner described herein enables the near-real time detection of cable damage incidents.

On a less urgent basis, the findings and activities of the system can be recorded in the network operator's databases and capture systems. Such status updates about the cable damage can be sent to the OSS (46, FIG. 5) in the form of non-urgent reports, preferably without having to require any processing on the part of the recipient.

Another view of the components, functions and actions of the LoS processing unit (22) can be seen in FIG. 5, in which the contents of alarm messages about the customer line such as port and cables details, duct topology and cable ID are used as inputs (40) to determine in S12 whether the pre-defined threshold is met or breached. As previously described, the processor requests a line test to be conducted. This is typically carried out by the usual line test module within the system, although it is possible to include a line test unit within the processing unit itself. The results of the line test are received by the processor in S14, which are then optionally checked against information from external data and information sources, such as the OSS-based databases (30, 32, 34, 36 and 38) feeding into the processor (22). If it is determined in this final review that the event is one for which a report should be generated or that action should be taken, outputs in the form of reports to various addressees (42, 44, 46) are generated and sent.

It is possible to have connection status LoS reports sent from DSLAMs directly to the processor without going through the EMS (14', FIG. 2). Also, while LoS alarms are ideally suited for use in that they are already generated by DSLAMs and collated at EMSs, it is possible to consider alternative sources of initial warning data, such as by separately polling customer premises on a periodic basis to find out if they are still connected to the DSLAM detector. In a suitable case where the OSS is not operating at or near capacity, it may be possible to configure the OSS to carry out the functions of the LoS alarm processing unit without unacceptable degradation to overall network performance. It is possible also to use the apparatus and methods of the invention in respect of optical fiber cables, by using e.g. an optical time domain reflectometer (OTDR) to carry out the line test for checking the connection of the cable to the access network node.

The "RADIUS" Implementation

In the above "DSLAM"-based implementation, the monitored link is located in the access network. Embodiments can be implemented in other ways, by monitoring other parts of the network. In this example, the monitored link extends further toward the core network, where embodiments can be deployed to significant advantage as well.

Figure 6:
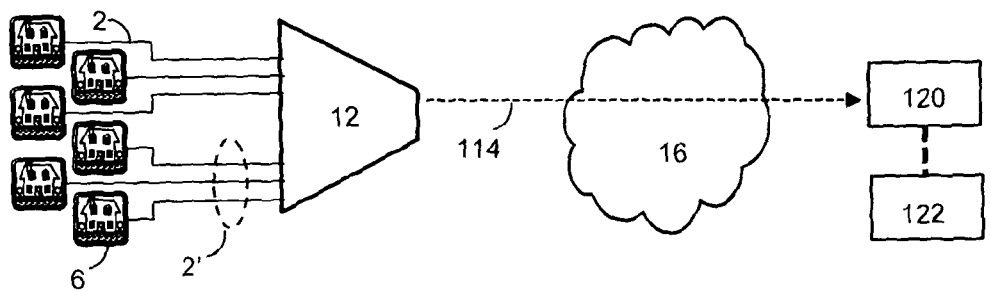
FIG. 6 depicts a network of the prior art.

FIG. 6 is a block diagram of the relevant components of a conventional telecommunications network, similar to that depicted in FIG. 1 above. In operation, a typical connection in the form of a PPP link (114) is established between the customer premises the BRAS unit (120) located in a point of presence nearer to the core network end, via the access backbone (16) and the DSLAM (12) node. As is known, PPP is a data link protocol used in establishing a direct connection between two networking nodes. The PPP connection allows a customer to connect to a public network such as the Internet via the core network. Typically, the BRAS serves as an interface between the access and core parts of the network or a broadband network gateway and serves to aggregate user PPP sessions from the access network. For the purposes of the present application at least, it is not considered to be part of the access network. The BRAS unit is in turn operationally coupled to a RADIUS server (122), which again is not logically located in the access network. As is known, a RADIUS server manages access to the public network, allowing for centralized authentication, authorization, and accounting functions to be carried out, thus enabling end user computers to connect to and use a network service. Of particular relevance to embodiments is the detection of loss of connection between a customer premises router (or other such computer networking device) with the BRAS, in the form of dropped broadband PPP sessions or such connections based on similar data link protocols.

Figure 3:
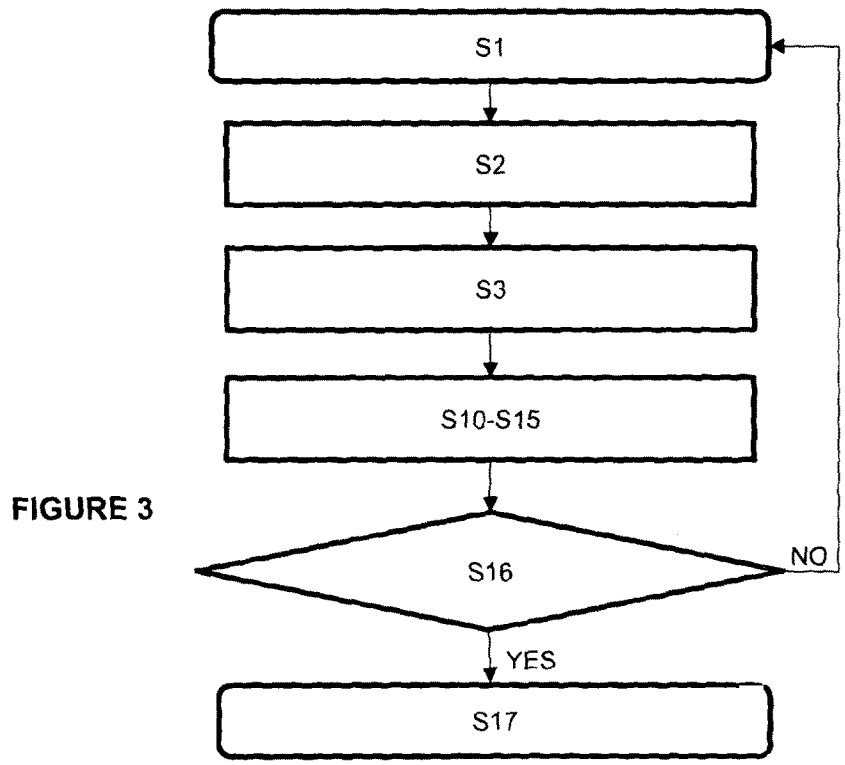
FIG. 3 is a flow chart of the process of detecting cable damage in the "DSLAM" implementation.
Figure 7:
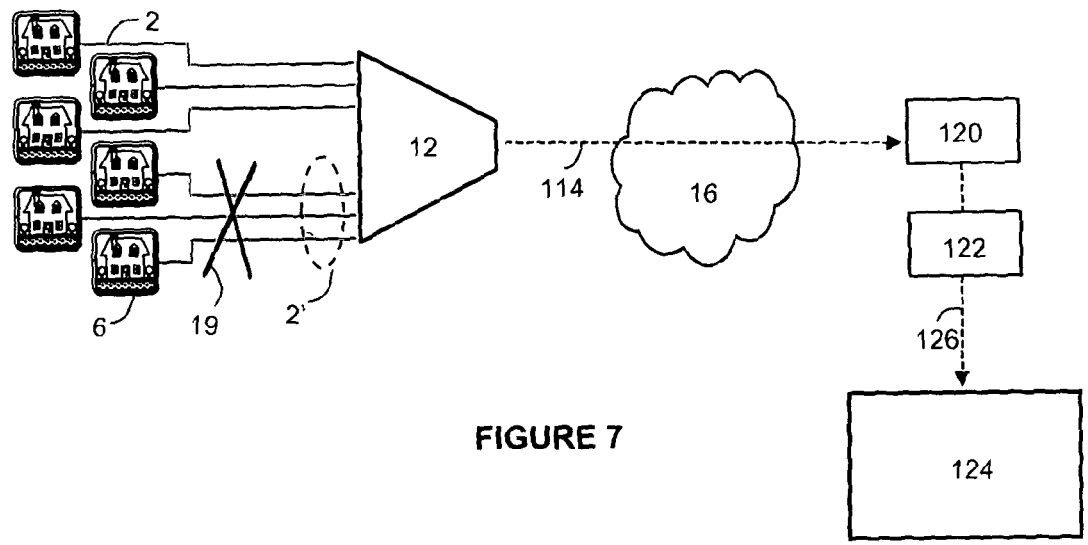
FIG. 7 depicts a network including a cable damage detection system of an embodiment of the "RADIUS" implementation.

FIG. 7 depicts an exemplary telecommunications network configured to operate in accordance with embodiments. Here, a section of the link between the customer premises (6) and the local exchange (or street cabinet) is shown to have been damaged or severed (19) in a similar manner as shown in FIG. 3 in connection with the previous "DLSAM" implementation. In this "RADIUS"-based implementation, the network is provided with a cable damage detection database/server (124) which is operatively connected to the network via the RADIUS server, which receives dropped PPP session data (126) from the BRAS server via the RADIUS unit. This detection server (124) can, in an exemplary implementation, take the form of a structured query language (SQL) server 2008, or any other suitable processor capable of managing data in relational database which is configured for the task of receiving inputs and outputs to and from a number of data sources and network components, in the manner described below. This can be a dedicated, stand-alone unit, or be comprised as additional functionality in an existing node at or near the DLSAM or RADIUS unit as the case may be.

Figure 8:
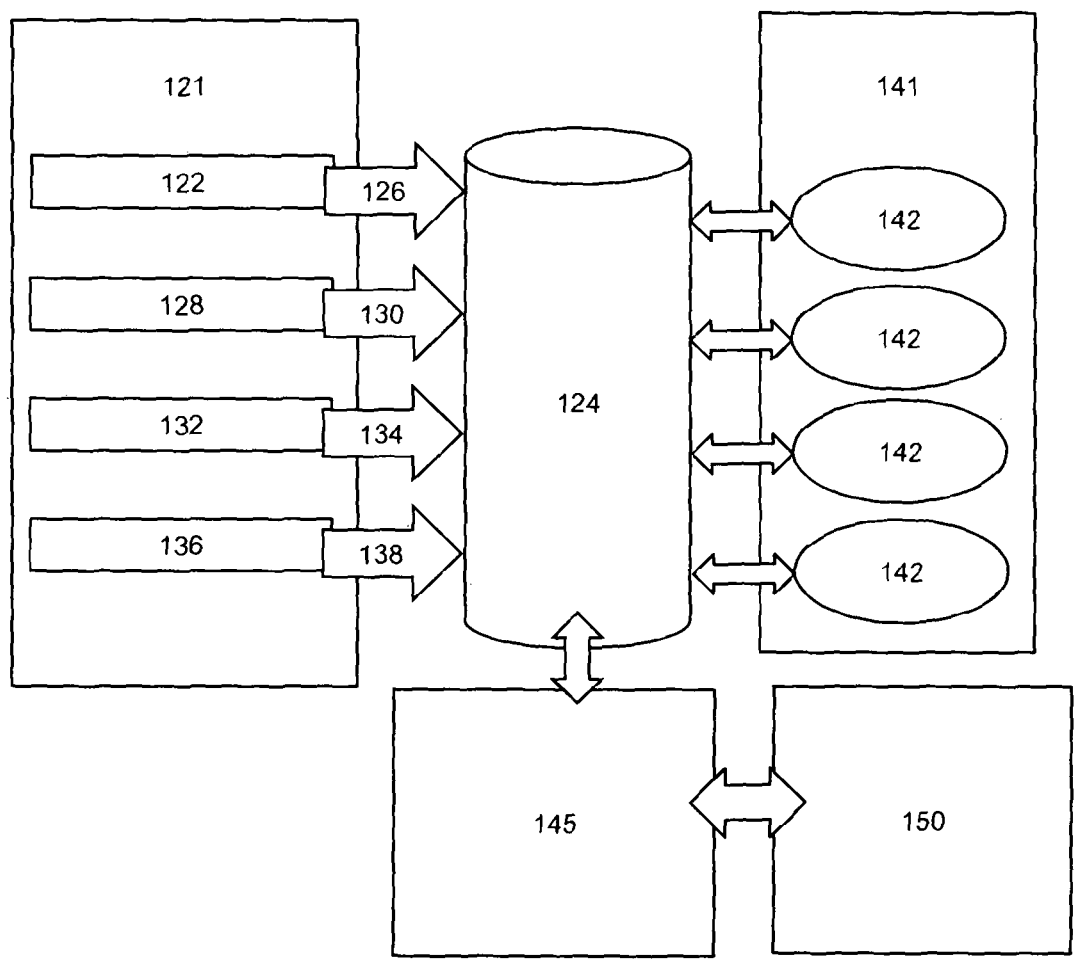
FIG. 8 is a schematic view of components of the cable detection system in the "RADIUS" implementation.

FIG. 8 depicts the network components and data flows to and from the detection server (124) in connection with the detection of cable damage within the network. As noted above, the damage detection database (24) is arranged to receive a variety of data types (21) fed from a number of data sources, which include:

Broadband ("BB") dropped session data (126) from the RADIUS unit (122),

Circuit routing data (30) from the customer service and support (CSS) database (128), which is a fault management system, Broadband infrastructure data (134) such as that pertaining to "20C" and "21C" data from a database holding such information (132) such as the "Improving Visibility of Repair for Broadband" (IVORBB) database owned by BT plc in the UK (BT), and Information about cable layout and infrastructure (138) from a database holding such information (136) e.g. the "Physical Inventory, Planning and eRecords" (PIPeR) database which is BT's local cable inventory and includes information about the length of each cable section, the XY coordinates of the ends of cable sections, and the cable termination points in the form of bar and pair from the telephone exchange main distribution frame and distribution side termination from the Primary Cross Connection Point (PCP).

As would be understood by the skilled person, the above data types may be all stored and accessed from one or more special-purpose databases, and further or fewer data types may be employed in the cable damage detection process. Also the data feeds (121) can be arranged to be pushed or pulled into the cable damage detection server (124) on a more or less continuous basis as and when it is required, or else be periodically refreshed e.g. on an hourly or daily basis. The flows and use of these data inputs (121) will be described in greater detail in connection with FIG. 9 below.

Turning back to FIG. 8, the cable damage detection engine (124) is also operatively connected to a number of processors or robots (141) which processes data received from the e.g. CSS via the detection server by way of e.g. relational algebra translation (RAT) transactions (142). Essentially, the robots comprise processors capable of receiving an input of data comprising lines identified to have lost their PPP connections, and causing a test routine to be run on such lines using a specific transaction e.g. relational algebra translation.

As the skilled person would appreciate, this task of the robots can be carried out by the detection server (24) itself, or by some other element on the server's instructions.

The damage detection server or database (124) is also operationally connected to a web server (145) running e.g. BlueDragon™, which provides information about the status of the network in connection with cable damage in the form of webpages. In one implementation, web server (145) is operatively connected to mapping applications and resources such as Ordnance Survey™ maps, Google™ maps or the like.

Figure 9:
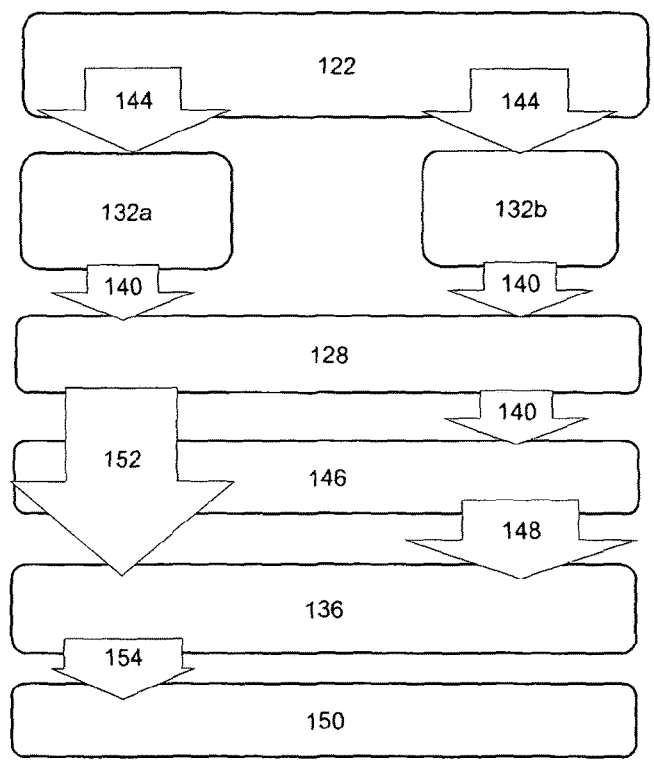
FIG. 9 depicts the process of detecting and locating cable damage within a network in the "RADIUS" implementation.

FIG. 9 depicts the components which operate in conjunction with the damage detection server (124) and the data flows between them. In one implementation, the detection server is configured to check for any session drop data (126) round the clock e.g. once every 2 minutes. At the start of the process, loss of connection on the monitored lines is detected as a session drop event by the RADIUS unit (122) which generates drop data in the known manner. Typically, session drop data includes identification and status data in respect of the affected lines, such as service ID or line card ID information (126), port number, and time stamp data. In an implementation, the service ID (144) is used as a "key" allowing for the dropped session data to be correlated to broadband infrastructure data (34) held by the access network layout and infrastructure (132). Because a network can comprise a number of types or generations of network infrastructure or architecture which coexist with each other e.g. the 21C and 20C broadband network infrastructures, separate IVORBB databases (132a, 132b) are involved in different cases. Advantageously, session drop data (126) is available from the RADIUS unit without the need for any reconfiguration of the system or its components, and is capable of flagging up all dropped session events in an agnostic manner i.e. regardless of the network technology (e.g. "21C" and "20C" technologies) and regardless of the location of the cause of the connection loss.

These steps are carried out by the detection server (124) together with the robots (141) receiving the data feeds (121). The service ID information is in this way converted to a telephone line number or directory number (DN) (140), which allows identification of the customer lines suffering from the loss of connection. As a next step, the DN together with the session drop data is used as the key for correlation with common routing data (30) obtained from the CSS (128) within the local area network, to trace how the affected circuit is routed through the network identified by the underground plant and structure carrying that circuit. This returns as a result a number or volume of session drops per PCP and/or DP, which is then compared by the detection server (124) against a pre-determined drop number threshold set.

If and when the volume of drops on a PCP or DP exceeds the threshold, then a first, initial, alert in the form of a "Potential Incident" is generated. The threshold can comprise a predetermined number of Potential Incidents about a particular cable or bundle within a predetermined time The threshold is selected and set by the network operator based on e.g. past experience and historical data, or on trial and error. In one implementation, the threshold alarm numbers and time periods are resettable metrices. The skilled person would appreciate that various criteria may be used for threshold setting: for example, based on the speed at which initial alerts are being received, instead of looking at the total number of Potential Incidents received per time period. In an example where a bundle of wires has been cut through, alerts would be generated for each cut cable, resulting in session drops which would all be detected by the RADIUS unit at almost the same time.

If the session drop volume threshold is exceeded, a line test (similar to that described above in connection with the "DSLAM" implementation) is conducted on the affected lines using a line test module (146) to confirm the initial alert. A line test could be conducted on the metallic link between the customer premises and e.g. a local exchange. In embodiments, the system is configured so that when the thresholds set in the system are exceeded, lines testing is automatically initiated. Generally and one embodiment, tests need only be conducted on only a subset of the potentially affected lines as a sample of e.g. two individual pairs can typically yield sufficiently accurate results representative of all the lines within a bundle identified to be suffering from a session drop. Testing only a few lines within a bundle in this way is more time- and cost-efficient, and further enjoys the positive advantage of helping to determine the cause of the signal loss: so for example where the line-tested sample cables of a bundle do not indicate a fault, it may be possible to rule out an incident of cable theft of that bundle. This process of checking the accuracy of the initial Potential Incident alarm is carried out by the robots (141) which select the lines for verification, by automatically accessing the CSS system (128) and running a line test using a specific transaction (e.g. a relational algebra translation transaction). In embodiments, the line test takes about a minute to run, and when completed the robot captures the line test result and stores this information in the cable damage detection server (124) for onward processing.

Routines within the cable damage detection server (124) then assess these test results and if they indicate a faulty copper connection, the initial warning is confirmed and the incident type/status is changed or upgraded from Potential Incident to a second alert in the form of an "Actual Incident." The next step is to find out the location of the incident. In one implementation, the distance (148) of the fault from the local exchange is discovered by comparing the test results on the metallic links with cumulative cable section length data previously obtained based on the cable infrastructure data (34, 36). This allows for the location of the Actual Incident to be plotted as XY coordinates (54) on a mapping application (50). At this stage, network incident status is updated on the web server (45), such as with details about the location of the incident, both in mapping and geographic terms, as well as in respect of the logical location within the network infrastructure.

The above process may include optional further review or verification steps as described above in connection with the "DSLAM" implementation. For example, the data indicating a Potential or Actual Incident may be refined or checked against external or other data relating to time of day, historic incidences and the like, weather reports, which could similarly help determine the nature of the damage, which in turn would affect the kind of response to be made.

The skilled person would also appreciate that variations on the direction and order of the data flows described in connection with FIGS. 8 and 9 can be implemented within the scope of embodiments. For example, dropped session data (126) can sent from the RADIUS server/unit (22) and/or to the IVORBB databases (32a, 32b) which identify corresponding DNs 141, which may then sent to the CSS database (128), and so on, instead of being fed into the detection server (124).

To summarize, the detection server serves as a real-time monitor or "burglar alarm" within the network that polices the links from the BRAS units to each of the customer premises around the clock. In an exemplary implementation the loss of a PPP connection between the customer premises and its associated RADIUS broadband server (22) is fed through to the cable damage detection engine (24). Upon receipt of signal indicating the loss of PPP connection, the cable damage detection processor (24) acts as a "correlation engine" by taking in and into account information about cable routings, cable infrastructure and length ends and the like in the network for the determination of the existence and location of the loss of connection. A two-step verification process is used, in which an initial suspicion of an event of cable damage is raised, which is then confirmed by means of a line test. The detection server works by recording "clumps" of dropped session data which can then be analyzed and a problem on the copper or the fiber can be assessed. By carrying out line tests, the correlation engine determines the location of a suspected event such as cable theft on a geographic map. The skilled person would appreciate that the above steps and processes need not be taken in the specific order described, nor is it essential that they be carried out in the precise manner set out. Additional steps can be included, and some of the steps may be replaced or omitted in dependence on the particular network, the type of available information, the circumstances in which incidents arise, and so on.

Advantageously, dropped session data detected by the RADIUS unit is "agnostic" as not being specific to any particular broadband technology in use (so allowing for e.g. deployment in both 20C and 21C networks, and NGA fiber delivered services). As a consequence, the method of the invention has the capability to detect and localize incidents on lineplant and hardware across both the access and core networks, providing a single end-to-end view of the entire network controlled by the operator.

Figure 10:
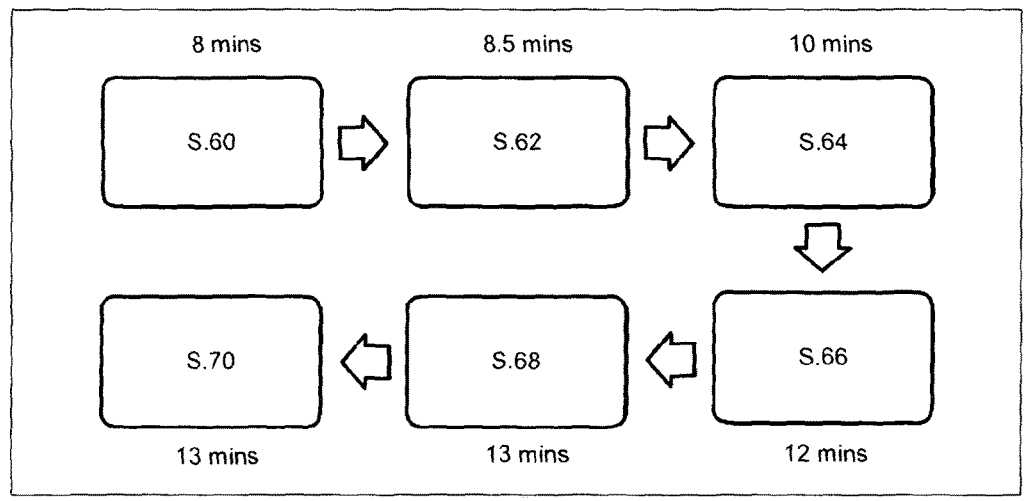
FIG. 10 depicts the processes flows and timings in the detection of cable damage in the "RADIUS" implementation.

FIG. 10 is a process flow chart depicting indicative timings of detection of an event causing cable damage using a cable damage detection server (124) of the system. In this example, the SQL import procedure of the detection server is configured to run once every two minutes to collect the PPP session drop data from the RADIUS data store. In a typical implementation where the RADIUS unit (122) receives dropped session data from a number of element manager systems (EMS) within the network, the applicants have found that dropped PPP data may take between 1 to 8 minutes to reach the RADIUS unit (122) after occurrence of the incident, depending on the EMS. It may take another 2 minutes for the data to reach the detection server (124). After the alert data is loaded (S.60) into the detection server say, 8 minutes after occurrence of the event which generated to the dropped session data, it can be correlated (S.62) by the CSS (28) to identify the common routing points within 8.5 minutes of occurrence of the incident. The correlation step takes about 2 minutes, so that within 10 minutes, the cable damage detection server (124) starts to determine (S.64) if the number of session drop alerts exceeds the drop number threshold in the manner discussed above. If a Potential Incident is indicated, a line test (S.66) is initiated at about the 12th minute, which takes 2 to 5 minutes depending on the incident type, on the basis of allowing 1 minute for each test. The result of the line test are then used to determine if more than one line is faulty or otherwise has lost connection (S.68) which result may be available as early as the 13th minute. This allows for a notification alarm to be raised (S.70) as a next step which can be generated and sent e.g. by email, a telephone call or the like, within a minute, if the initial alert is escalated to Actual Incident status. In this way, cable damage events such as those caused by cable theft, can be pinpointed on a map as quickly as within 15 minutes or even less, of occurrence of the event.

It is not intended that features, methods and characteristics of the implementations above under the "DLSAM" or "RADIUS" labels should be construed strictly within the particular implementation. The skilled person would appreciate that certain steps described under one heading may be used to good effect in the other implementation. For example, the generation of Potential and Actual Incident alarms or states could be used in the "DSLAM"-based approach, or the inclusion of inventory data in the operation of the processor in the "DSLAM"-based solution to more precisely pinpoint the location of the event. Also, it would also be possible to combine the entire "DSLAM" and "RADIUS" (or any other) e.g. sequentially, so as to obtain an even clearer and firmer indication of a connection fault, in those cases where parties prefer greater certainty over speed of response.

All Implementations

Constant monitoring of all lines on the network using implementations and embodiments as described herein enables the near-real time detection of cable damage incidents. The notification process initiated by the identification of a confirmed incident (e.g. in the form of an Actual Incident) sets off a cascade of activities in which messages are sent to various parties for alert and/or further verification purposes. In a system set up to detect and deal with copper cable theft in the access network, messages can be sent to a central or regional office responsible for taking action in the event of suspected events of copper theft, which may be located in e.g. an exchange building. After any further verification, personnel can be rapidly dispatched to the identified scene of the activity or event e.g. within minutes of the act of cutting the cable. The initial alert message may also be sent to the authorities such as a police, at the same time as to the copper theft action center. Because an event identified by alerts generated by the system has already been "pre-tested" in the second step of the process involving the line test, parties can be confident that they are unlikely to be acting on a false alarm.

As might be expected, a greater speed of response can significantly improve the success rate in apprehending the parties involved, potentially to catch the culprits red-handed, but this speed is tempered by an inbuilt verification of the initial alert, to ensure that parties take action only on the type of connection faults which warrant such further action. Additionally, other parties such as end-customers, communications service providers (CPs, who provide retail broadband services to end customers) and the like, can be also alerted to the incident on a real-time basis so that they may take any remedial action needed at their end in respect of their customers who have lost service. The entire notification process can be partly- or wholly-automated which may speed up the response time even further, e.g. by automatedly generating reports which are sent automatically to the parties who need to be informed about such outages.

As part of the notification process, an appropriate report is generated. The system can be configured for such a report to be issued once the line test is complete or at any other stage, even before an Actual Incident is identified. In a more preferred implementation however, reports take the form of webpages with details of incidents (e.g. network/logical and/or geographic location information, time of day, numbers of lines affected, a shortlist of the possible causes of the session loss, etc.). These can be then transmitted in real-time or near time-time. On a less urgent basis, the findings and activities of the system can be recorded in the network operator's databases and capture systems. Such status updates about the cable damage can be sent to the Operation Support System (OSS) in the form of non-urgent reports, advantageously without having to require any processing on the part of the recipient.

Having real time detection and response to events causing network fault such as cable theft realizes a significant number of benefits, including:

Reduction in cable theft
Reduction in the amount of capital expenditure
Faster and more cost-effective fault localization
Faster restoration of service because often the cables can be re-jointed or "pieced in"
Reduction in fault volumes because faults are often fixed before even customers know there is a problem
Reduction in customer complaints and consequential brand damage
Early detection of third party damage and cost recovery In further implementations, the detection toolset can be configured to reduce fault volumes through preventative activities enabled by the quick detection capabilities of the detection system of the invention, such as early fault detection, the grouping of common faults, introducing fewer network intervention faults by engineers working on network plant, and developing and adopting "Start to Notify" approach (in which CPs are advised of the matter sooner than later, with an assurance that action was being taken). Such a proactive approach can considerably improve field productivity by saving time locating faults, particularly in the need for multiple identification of "common faults" by more than one party. Another significant advantage is that network faults can be identified and action taken without need to wait for customers to file complaint reports. Embodiments can realize reduced network intervention and improved network quality can also be delivered through the improved accuracy enabled the generation of locational information for use by field engineers, resulting in fewer "cut and tests" responses to events involving dropped session data.

The apparatus, methods and configurations described above and in the drawings are for ease of description only and not meant to restrict the scope of the claims to any particular embodiment. The skilled person would appreciate that various sequences and permutations on the apparatus and methods described are possible within the scope of this invention as disclosed. For example, the dropped session data threshold can be manually fine-tuned by an operative depending on the requirements of the time and of the particular network, allowing for the setting of different trigger points (DP and PCP) at which incidents are raised. The line test system may detect faulty line conditions (e.g. battery and earth faults which are usually caused by water ingress) even though the customer still has service (and may not know there is a problem with their line), albeit at a reduced speed. In such a case the system may be set up so that an initial alert may still be raised, but without progressing to the line test stage of the process unless there is a clear indication of a clean break in a cable.

This specification also includes the subject matter of the following numbered clauses (which correspond to the claims of earlier filed European patent application No. 12250081.2 from which the present application claims priority):

First clause: A system for monitoring connection status of a cable comprising a detector connected to the cable, a processor for receiving from the detector one or more connection status reports about connection of the cable to an access network node, the processor being further configured to cause, upon a received report threshold being reached, a test of connection of the cable to the access network node to be conducted, and a line test module for testing the connection of the cable to the access network node.

Second Clause: A system according to the first clause wherein the report threshold comprises a predefined number of connection status reports about the cable over a predefined time period or interval.

Third Clause: A system according to the first or second clauses wherein the processor is further configured to receive from the line test module a test result about the connection of the cable to the access network node, and to process the test result together with external information affecting the connection status of the cable.

Fourth clause: A system according to any preceding clause wherein the processor is configured to accept external information as inputs from an operation support system.

Fifth clause: A system according to any preceding clause wherein the detector is comprised in an access module, and wherein the one or more connection status reports are sent by the detector to the processor via an element manager system.

Sixth clause: A system according to any preceding clause wherein the connection status report comprises a loss of synchronization alarm generated by a digital subscriber line access multiplexer or a multi-service access node.

Seventh clause: A system according to any preceding clause wherein the access network node comprises a customer node.

Eighth Clause: A system according to any preceding clause wherein the detector further comprises a report generator for generating and sending a connection status alert.

Ninth Clause: A processor for use in a system according to any preceding clause being configured to receive from a detector one or more connection status reports about connection of the cable to an access network node, to cause, upon a report threshold being reached, a test of a connection of the cable to the access network node to be conducted, the report threshold comprising a predefined number of connection status reports about the cable over a predefined time period or interval, to receive a test result about the connection of the cable to the access network node, and to process the test result together with external information affecting the connection status of the cable.

Tenth clause: A method of monitoring connection status of a cable connected to a detector, comprising receiving from the detector one or more connection status reports about connection of the cable to an access network node, determining if a received report threshold has been reached, and causing a test of connection of the cable to the access network node to be conducted.

Eleventh Clause: A method according to the tenth clause further comprising receiving a test result about the connection of the cable to the access network node, and processing the test result together with external information affecting the connection status of the cable.

Twelfth Clause: A method according to the tenth clause or the eleventh clause wherein the connection status reports are received from the detector to the processor via an element manager system.

Thirteenth Clause: A method according to any one of the tenth to twelfth clauses further comprising generating and sending a connection status alert.

The invention claimed is:

1. A system for monitoring connection status of a cable in a network comprising:
   a detector operationally connected to the cable to generate one or more loss of service (LoS) alerts about connection of the cable to a network node;
   a metal line test module; and
   a processor to
      receive from the detector the one or more LoS alerts,
      cause, upon a LoS alert threshold being reached after receiving the one or more LoS alerts, a test of the cable by the metal line test module to confirm a connection status of the cable,
      receive external information possibly affecting the connection status of the cable,
      identify whether any of the external information is likely to have an impact on the connection status of the cable, and
      check a result of the test of the cable by the metal line test module against the identified external data.

2. A system according to claim 1 wherein the network node is comprised in a digital subscriber line access multiplexer (DSLAM) or a multi-service access node (MSAN), and wherein the one or more LoS alerts comprises a loss of synchronization alarm.

3. A system according to claim 1 wherein the network node is comprised in a broadband remote access server (BRAS), and wherein the one or more LoS alerts comprises dropped point-to-point protocol (PPP) session data.

4. A system according to claim 1 wherein the one or more LoS alerts includes an identity of the cable, and wherein the LoS alert threshold comprises a predetermined number of LoS alerts within a predetermined time.

5. A system according to claim 1, wherein the system is for use in a network comprising a plurality of cables, wherein the processor is to receive network information comprising at least one of circuit routing data or network infrastructure data, and to use the network information to identify or locate one or more of the plurality of cables about which the one or more LoS alerts are being received by the processor.

6. A system according to claim 1 wherein the processor is further to:
   generate a first LoS alert upon determination that the LoS alert threshold has been reached;
   trigger operation of the metal line test module upon generation of the first LoS alert; and
   generate a second, confirmatory, LoS alert upon confirmation of a faulty connection status of the cable.

7. A system according to claim 1 further comprising a report generator to generate and send a connection status alert as a result of the test of the cable by the metal line test module.

8. A system according to claim 1 further comprising a mapping application to locate an event causing a faulty connection status of the cable.

9. A method of monitoring connection status of a cable operatively connected to a detector, comprising:
   receiving from the detector one or more loss of service (LoS) alerts about connection of the cable to a network node;
   causing, upon a LoS alert threshold being reached after receiving the one or more LoS alerts, a metal line test of the cable to confirm the connection status of the cable to the network node;
   receiving external information possibly affecting the connection status of the cable;
   identifying whether any of the external information is likely to have an impact on the connection status of the cable; and
   checking a result of the metal line test of the cable against the identified external data.

10. A method according to claim 9 wherein the one or more LoS alerts relates to a link between a customer premises and a digital subscriber line access multiplexer (DSLAM) or a multi-service access node (MSAN), and wherein the one or more LoS alerts comprises a loss of synchronization alarm.

11. A method according to claim 9 wherein the one or more LoS alerts relates to a link between a customer premises and a broadband remote access server (BRAS), and wherein the one or more LoS alerts comprises dropped point-to-point protocol (PPP) session data.

12. A method according to claim 9, for use in a network comprising a plurality of cables each being operatively connected to a detector, comprising:
   receiving, by a processor from the detector, one or more LoS alerts about a respective connection of one or more of the plurality of cables to a network node;
   receiving, by the processor, network information comprising at least one of circuit routing data or network infrastructure data; and
   using the network information to identify or locate one or more of the plurality of cables about which the one or more LoS alerts are being received by the processor.

13. A method according claim 9 further comprising generating and sending a connection status alert as a result of the metal line test of the cable.

\* \* \* \* \*